United States Patent [19]
Hoffman et al.

[11] Patent Number: 5,360,942
[45] Date of Patent: Nov. 1, 1994

[54] MULTI-CHIP ELECTRONIC PACKAGE MODULE UTILIZING AN ADHESIVE SHEET

[75] Inventors: Paul R. Hoffman; Dexin Liang, both of Modesto, Calif.

[73] Assignee: Olin Corporation, Manteca, Calif.

[21] Appl. No.: 153,240

[22] Filed: Nov. 16, 1993

[51] Int. Cl.⁵ .................................. H01L 23/02
[52] U.S. Cl. .................................... 174/52.4
[58] Field of Search ............ 174/52.4; 257/666, 670, 257/671, 676, 684, 688, 701, 703, 711, 782, 783; 361/717, 718, 723, 807, 808, 809, 810, 812, 813, 820; 29/589, 591

[56] References Cited

U.S. PATENT DOCUMENTS

| | | | |
|---|---|---|---|
| 3,784,440 | 1/1974 | Grunwald et al. | 428/417 |
| 3,793,064 | 2/1974 | Budd et al. | 252/514 X |
| 4,042,952 | 8/1977 | Kraybill | 257/724 |
| 4,461,924 | 7/1984 | Butt | 174/52.4 |
| 4,480,262 | 10/1984 | Butt | 257/675 |
| 4,495,378 | 1/1985 | Dotzer et al. | 174/252 |
| 4,509,096 | 4/1985 | Baldwin et al. | 361/719 |
| 4,539,622 | 9/1985 | Alasoui | 174/52.4 X |
| 4,542,439 | 9/1985 | Dick | 361/306 X |
| 4,561,006 | 12/1985 | Currie | 257/697 |
| 4,607,276 | 8/1986 | Butt | 257/674 |
| 4,611,745 | 9/1986 | Nakahashi et al. | 228/123.1 |
| 4,622,433 | 11/1986 | Frampton | 174/52.4 |
| 4,630,172 | 12/1986 | Stenerson et al. | 361/386 |
| 4,633,573 | 1/1987 | Scherer | 29/589 |
| 4,761,518 | 8/1988 | Butt et al. | 174/52.4 |
| 4,767,674 | 8/1988 | Shirai et al. | 428/461 |
| 4,827,376 | 5/1989 | Voss | 361/708 |
| 4,873,566 | 10/1989 | Hokanson et al. | 257/98 |
| 4,888,449 | 12/1989 | Crane et al. | 174/52.4 |
| 4,939,316 | 7/1990 | Mahulikar et al. | 174/52.4 |
| 4,943,468 | 7/1990 | Gordon et al. | 428/210 |
| 4,967,260 | 10/1990 | Butt | 257/668 |
| 5,044,074 | 9/1991 | Hadwiger et al. | 29/848 |
| 5,068,708 | 11/1991 | Newman | 257/668 |
| 5,077,595 | 12/1991 | Fukunaga | 257/659 |
| 5,121,293 | 6/1992 | Conte | 361/715 |
| 5,124,783 | 6/1992 | Sawaya | 257/724 |

Primary Examiner—Leo P. Picard
Assistant Examiner—Christopher Horgan
Attorney, Agent, or Firm—Gregory S. Rosenblatt

[57] ABSTRACT

There is provided a module for supporting a plurality of semiconductor devices within an electronic package. The module has a support substrate and an apertured substrate laminated together with a polymer adhesive. A plurality of semiconductor devices are disposed within apertures formed in the apertured substrate and bonded to the support substrate by that same polymer adhesive.

23 Claims, 3 Drawing Sheets

MULTI-CHIP ELECTRONIC PACKAGE MODULE UTILIZING AN ADHESIVE SHEET

BACKGROUND OF THE INVENTION

This invention relates to electronic package modules. More particularly, an apertured substrate is adhesively bonded to a support substrate. One or more semiconductor devices disposed within the apertures are bonded to the support substrate utilizing the same adhesive.

Adhesively sealed metal packages are frequently used to encapsulate semiconductor devices. One package is disclosed in U.S. Pat. No. 4,939,316 to Mahulikar et al, which is incorporated by reference herein in its entirety. The package has anodized aluminum base and cover components defining a central cavity. A semiconductor device is bonded either to the base or to a leadframe paddle. A leadframe is disposed between the base and cover and an adhesive, typically a thermosetting epoxy resin, bonds a central portion of the leadframe to both the base and the cover encapsulating the semiconductor device. Thin bond wires electrically interconnect the semiconductor device to an inner portion of the leadframe while an outer portion of the leadframe is electrically interconnected to an external device such as a printed circuit board.

As the size of semiconductor devices decreases and the need for faster operating devices increases, it is desirable to house multiple semiconductor devices on the same module. One such module is disclosed in U.S. Pat. No. 5,124,783 to Sawaya which discloses an insulating substrate adhesively bonded to a centrally positioned support substrate. Apertures formed in the insulating substrate permit direct bonding of semiconductor devices to the support substrate with a conductive adhesive such as a silver filled epoxy resin. This package requires separate conductive die attach adhesive preforms to be deposited for each semiconductor device with precise alignment of each preform and accurate control of the volume of adhesive. If too small a volume of adhesive is utilized the semiconductor device may disengage from the support substrate. If excess adhesive is present, the adhesive may extend over electrically active surfaces of the semiconductor devices interfering with wire bonding. The thermosetting epoxy die attach preforms are difficult to remove and then accurately reposition after cure to replace defective semiconductor devices. As the number of semiconductor devices on a module increases, the cost associated with a defective device greatly increases.

Another type of package for housing a plurality of semiconductor devices is disclosed in U.S. Pat. No. 5,121,293 to Conte. A nonconductive substrate is press fit over a metallic heat sink. The nonconductive substrate includes apertures for housing semiconductor devices and circuit traces for tape automated bonding electrical interconnection of the semiconductor devices. The semiconductor devices are positioned within the aperture and the apertures partially filled with a thermoplastic resin to support the semiconductor devices in close proximity to the metallic heat sink. While the use of the thermoplastic facilitates replacement of defective semiconductor devices, each aperture is separately filled, requiring accurate placement of the adhesive and accurate control of the adhesive volume.

There exists, therefore, a need for an electronic package module which is capable of housing a plurality of semiconductor devices which is both reworkable and does not require accurate control of adhesive placement or adhesive volume.

SUMMARY OF THE INVENTION

Accordingly, it is an object of the invention to provide a module for an electronic package which is capable of housing a plurality of semiconductor devices. It is a feature of the invention that the module is reworkable and does not require accurate control of polymer adhesive placement or volume. It is another feature of the invention that an apertured substrate is laminated to a support substrate with a sheet of adhesive. Yet another feature of the invention is that a plurality of semiconductor devices are bonded to the support substrate utilizing the same sheet of adhesive. As still another feature of the invention, the assembled module may be electrically interconnected to a leadframe and encapsulated in an electronic package.

It is an advantage of the invention that the single sheet of adhesive both laminates the apertured substrate to the support substrate and bonds the semiconductor devices so that accurate positioning of the adhesive is not required. Another advantage is that the thickness of the adhesive sheet is controlled more accurately than a paste. A controlled volume of adhesive is readily available in the desired location. Yet another advantage of the invention is that if the semiconductor devices are bonded with a thermoplastic resin, the devices may be readily removed for replacement of defective components. When a thermosetting resin is used, the devices may be removed and replaced by heating the adhesive to above the glass transition temperature. A further advantage is that since the adhesive is applied to essentially the entire support substrate, there is no need for costly equipment to control dispense locations or need for a multiplicity of dispensing means for die attach materials of different sizes.

In accordance with the invention, there is provided a module for an electronic package. The module has a support substrate and an apertured substrate adjacent the support substrate. The apertured substrate contains at least one through aperture. A polymer adhesive is disposed between and bonded to both the support substrate and the apertured substrate. At least one semiconductor device is disposed within at least one of the apertures and bonded to the support substrate by the polymer adhesive.

The above stated objects, features and advantages will become more apparent from the specification and drawings which follow.

IN THE DRAWINGS

DETAILED DESCRIPTION

Figure 1:
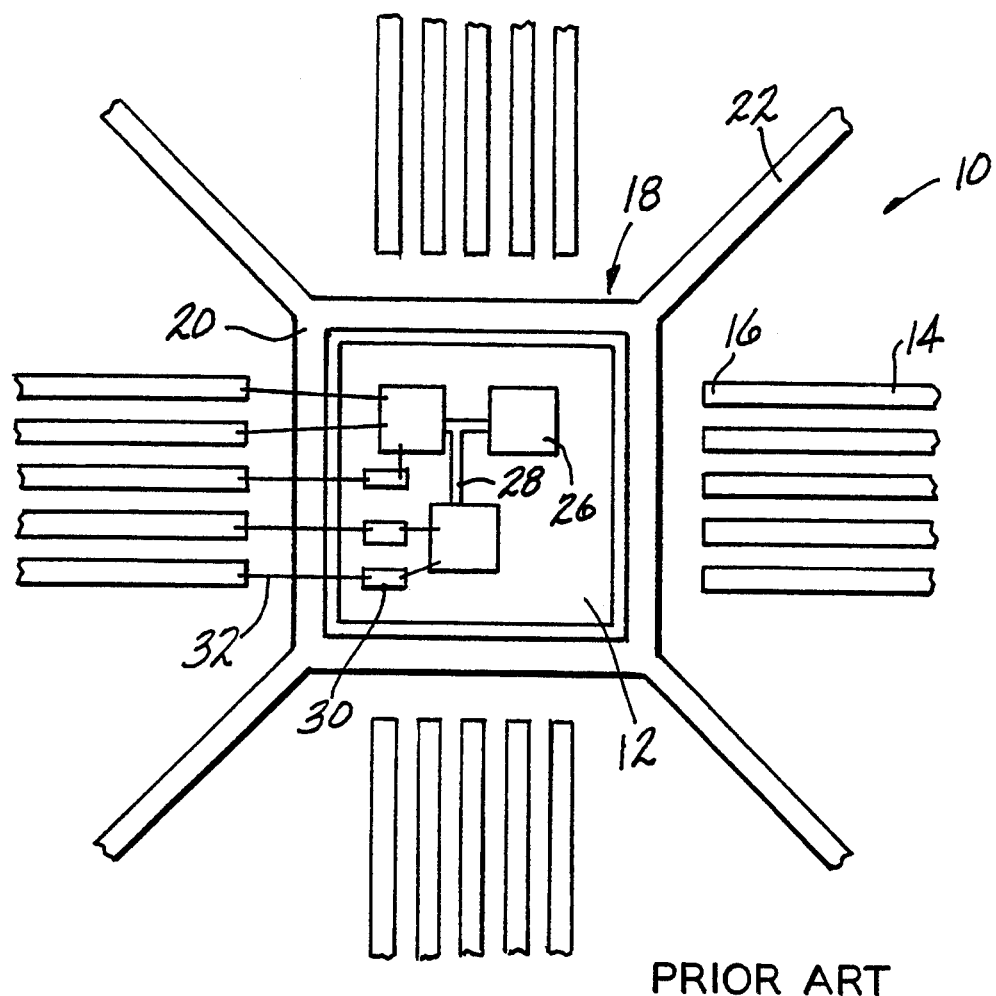
FIG. 1 shows in top planar view a multi-chip module for an electronic package adhesively bonded to a support substrate as known from the prior art.

FIG. 1 shows in top planar view a leadframe assembly 10 incorporating a multi-chip module 12 as known from the prior art, for example, as illustrated in U.S. Pat. No. 5,124,783.

The leadframe assembly includes a plurality of leads 14 terminating at inner lead ends 16. The inner lead ends 16 approach a central region 18 from one or more sides. Typically, the inner lead ends 16 approach the central region 18 from two sides (a dual in line package) or four sides (a quad package). Disposed within the central region is a support substrate 20 which may be a die attach paddle supported by tie bar struts 22.

The multi-chip module 12 is formed from an electrically nonconductive material such as a polyimide film or a ceramic. The electrically nonconductive material is bonded to the support substrate 20 by a thermosetting polymer adhesive 24, typically an epoxy sheet.

Chip attachment sites are formed on a surface of the nonconductive material to receive semiconductor devices 26. Electric circuit traces 28 electrically interconnect the semiconductor devices 26. Interposer circuits 30 can be present to shorten the length of the bond wires 32 which electrically interconnect the semiconductor devices 26 to the inner lead ends 16 of the leadframe.

Figure 2:
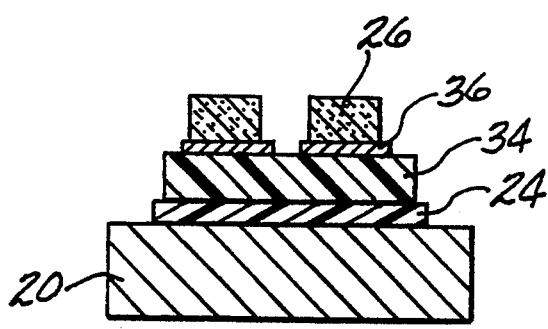
FIG. 2 shows in cross-sectional representation a first embodiment of the prior art multi-chip module of FIG. 1.

FIG. 2 illustrates in cross-sectional representation a first embodiment of the prior art multi-chip module. A plurality of semiconductor devices 26 are supported on a support substrate 20. A nonconductive material 34 is adhesively bonded to the support substrate 20 by a thermosetting polymer adhesive 24. Conductive bond pads 36 are formed on the opposing side of the nonconductive material for attachment of the semiconductor devices 26. Typically, the bond between the conductive bond pads 36 and the semiconductor devices 26 are a conductive thermosetting adhesive such as a silver filled epoxy. The bonding means must be accurately screened onto the conductive bond pads to prevent electrical shorting between adjacent bond pads. Additionally, a sufficient volume of bonding means must be provided to ensure the semiconductor device remains adherent to the nonconductive material 34.

Figure 3:
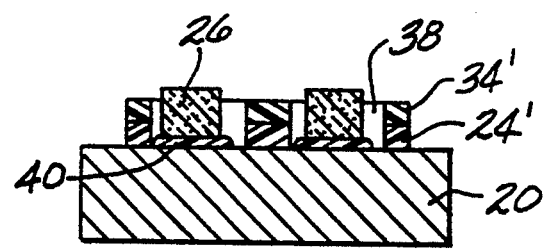
FIG. 3 shows in cross-sectional representation a second embodiment of the prior art multi-chip module of FIG. 1.

A second embodiment of the prior art multi-chip module is illustrated in cross-sectional representation in FIG. 3. The dielectric nonconductive material 34' contains a plurality of apertures 38. A thermosetting polymer adhesive 24' containing apertures in alignment with the apertures 38 bonds the nonconductive material 34' to the support substrate 20. A plurality of semiconductor devices 26 are then bonded to the support substrate 20 by die attach 40. The die attach 40 is any suitably electrically and/or thermally conductive material. Typically, a filled epoxy resin is utilized. The epoxy resin may be filled with a metallic material such as silver flake if both electrical and thermal conductivity is required or with ceramic particles such as silicon carbide if thermal conductivity with electrical resistivity is required.

The die attach material 40 is typically provided to the apertures 38 as a liquid. The positioning of the die attach material 40 and the volume of material, must be accurately controlled to ensure that the semiconductor devices 26 are bonded to the support substrate 20 and that the die attach material does not coat the top face of the semiconductor device 26. Any die attach material on the vicinity of the top face of the semiconductor devices 26 can interfere with wire bonding.

Applicant's invention eliminates the need to accurately control both the placement and the volume of die attach material. As illustrated in top planar view in FIG. 4, a leadframe assembly 10 is provided. The leadframe assembly 10 includes a plurality of leads 14 terminating at inner lead ends 16. The inner lead ends 16 approach a central region 18 from one or more sides. Disposed within the central region 18 is a support substrate 20. Preferably, the support substrate 20 is a die attach paddle supported by tie bar struts 22. Alternatively, the support substrate 20 may be a raised portion of the base of the semiconductor package. An apertured substrate 42 is bonded to the support substrate 20 by a polymer adhesive 44.

The apertured substrate 42 includes a plurality of apertures 38 for receiving semiconductor devices (not shown). Preferably, the polymer adhesive 44 is a unitary sheet extending under substantially the entire surface of the apertured substrate 42 such that the polymer adhesive 44 is exposed through the apertures 38. The polymer adhesive is a suitable polymer resin, either thermosetting or thermoplastic.

A preferred thermosetting adhesive is an epoxy resin having a cure temperature of from about 80° C. to about 300° C. The cure pressure is from about 1 to about 5 psi and the cure time from about 10 seconds to about 8 hours. The thermosetting adhesive may be filled to influence its properties. For example, silver flakes will increase electrical and thermal conductivity. $Al_2O_3$ particles will increase thermal conductivity.

A preferred thermoplastic adhesive is a polyetheretherketone resin having a cure temperature of from about 250° C. to about 375° C. The higher minimum temperature of the thermoplastic resin is to prevent softening of the adhesive when the semiconductor devices generate heat during operation or during wire bonding or other assembly operations. A typical cure time is from about 10 seconds to about 2 minutes at a cure pressure of from about 1 to about 10 psi. The thermoplastic adhesive may be filled to influence properties. Silver flakes will increase electrical and thermal conductivity. $Al_2O_3$, AlN and diamond particles will increase thermal conductivity.

Preferably, the thermoplastic material has a softening temperature in the range of from about 200° C. to about 400° C. and preferably from about 250° C. to about 375° C. The minimum temperature is established by the operating temperature of the semiconductor devices and the maximum assembly temperature to ensure the devices do not become loose and shift position during operation. The maximum temperature is determined by that temperature to which the semiconductor devices may be heated for a short period of time without detrimental effect.

The thickness of the polymer adhesive 44 is from about 0.001 to about 0.010 inch and preferably from about 0.003 to about 0.005 inch. The polymer adhesive 44 may be applied by any suitable means such as preheating either the support substrate 20 or the apertured substrate 42 and placing a film of the polymer resin 44 on the preheated substrate. Alternatively, if the polymer resin 44 is a liquid or paste, the polymer is screen printed or sprayed onto either substrate. When screen printing, spraying or a similar approach is utilized, solvents should be removed by evaporation prior to lamination.

The two substrates are next laminated, utilizing a desired pressure (typically from about 1 to about 10 psi) at a suitable cure temperature (typically from about 250° C. to about 375° C.) for a suitable time (typically from about 10 seconds to about 10 minutes). Following lamination, as shown in FIG. 4, the polymer adhesive 44 bonds the apertured substrate 42 to the support substrate 40 and is visible through the apertures 38.

The apertured substrate 42 may be any suitable material such as a ceramic, polymer or metal. Suitable ceramics include aluminum oxide, aluminum nitride, silicon carbide and silicon nitride. The polymeric substrate may be rigid or flexible and include polyimides and epoxies. Suitable metals include alloys, composites and compounds. Preferred metallic substrates are copper, aluminum, alloys thereof and low expansion materials such as steel and iron-nickel alloys. The apertured substrate 42 is electrically nonconductive. If a ceramic or polymer is utilized, electrical insulation is inherent. If a metal is utilized, the apertured substrate is coated with either an organic or inorganic dielectric layer. Typical dielectric layers include a coating of an epoxy resin or anodization if the apertured substrate is aluminum or an aluminum alloy.

Circuit traces 28 and/or interposer circuits 30 are then formed on the electrically nonconductive face of the apertured substrate 42. The electrically conductive features may be formed by any means known in the art. One way is to screen print a palladium nickel metallization paste. The paste is fired and copper electrolytically deposited on the fired metallization to a desired thickness. The apertured substrate may have one or more circuit layer separated by dielectric layers, typically referred to as single layer or multi-layer circuits.

Figure 4:
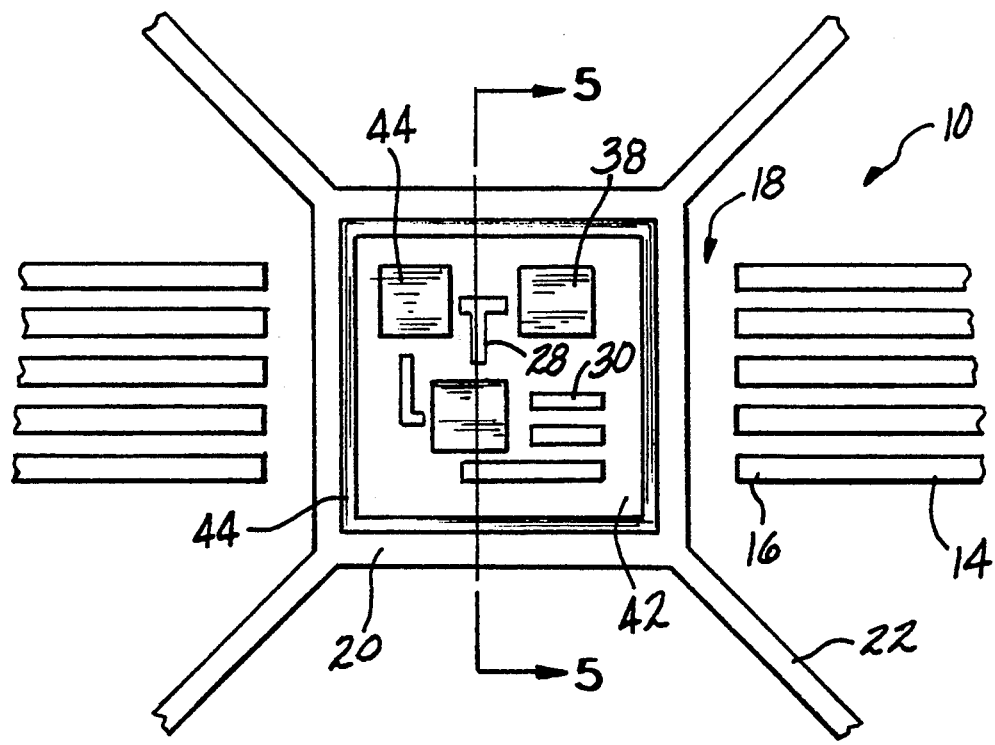
FIG. 4 shows in top planar view the module of the present invention prior to bonding of semiconductor devices.
Figure 5:
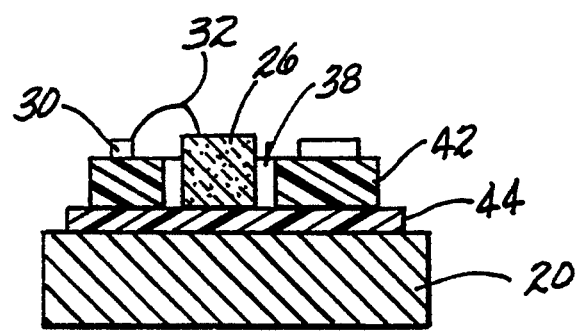
FIG. 5 shows in cross-sectional representation the positioning of a semiconductor device on the electronic module of FIG. 4.

FIG. 5 shows in cross-sectional representation the embodiment of FIG. 4 with the addition of a semiconductor device 26 disposed within the aperture 38. The semiconductor device 26 is bonded to the polymer adhesive 44. Typically, a thermoplastic polymer adhesive is preheated to the softening temperature by heating the support substrate 20. A thermosetting polymer adhesive is heated to above the glass transition temperature. The polymer adhesive 44 may be reheated to softening multiple times which allows for both sequential bonding of semiconductor devices 26 and removal of defective devices. Typically the support substrate 20 is heated to a temperature from about 250° C. to about 375° C. to soften the polymer adhesive 44 for receiving the semiconductor devices 26. The multi-chip module assembly is then completed by electrically interconnecting the semiconductor device 26 to interposer circuits 30 or directly to the inner lead ends 16 of a leadframe (not shown). The electrical interconnection may be by bond wires 32 or by thin strips of copper foil as utilized in tape automated bonding.

Alternatively, the assembly process is modified so that bonding of the semiconductor devices 26 is concurrent with lamination of the apertured substrate 42 to the support substrate 20.

Figure 6:
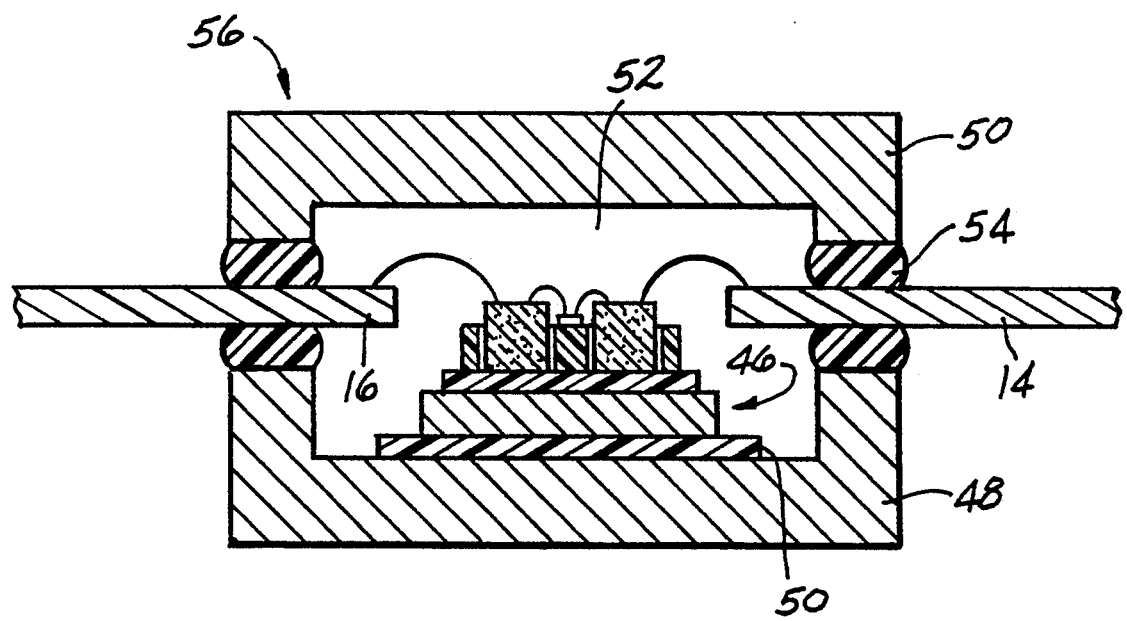
FIG. 6 shows in cross-sectional representation the encapsulation of the module of the invention in an electronic package having discrete base and cover components.
Figure 7:
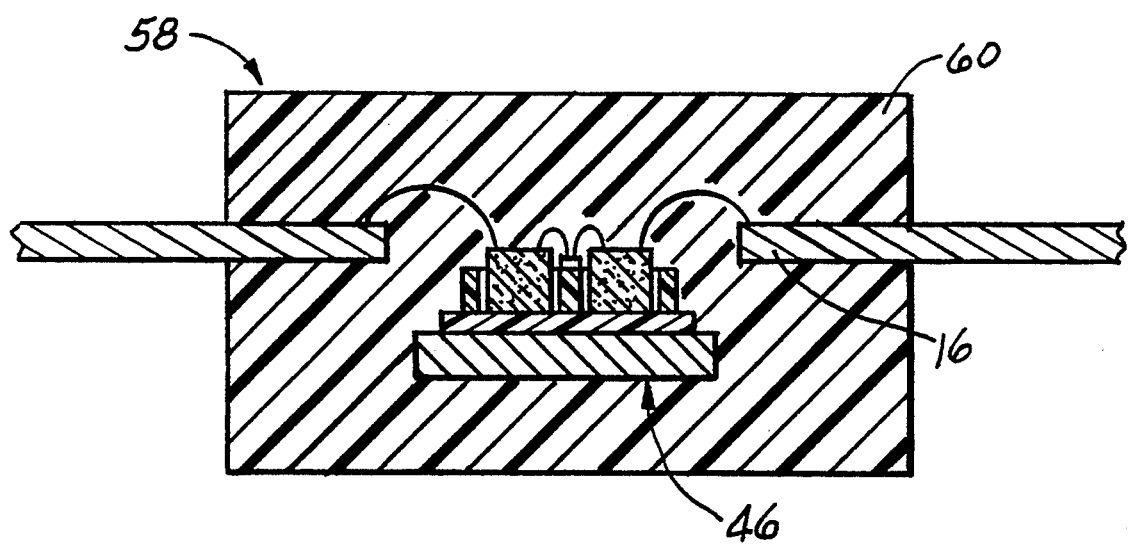
FIG. 7 shows in cross-sectional representation the module of the invention in a molded plastic semiconductor package.

The multi-chip module assembly is then housed in an electronic package as illustrated in cross-sectional representation in FIGS. 6 and 7. In FIG. 6, the multi-chip module assembly 46 is bonded to an electronic package base 48 by a polymer adhesive 50. The polymer adhesive 50 may be any suitable thermoplastic or thermosetting polymer resin such as an epoxy. A cover 50, in combination with the base 48 defines a cavity 52 for receiving the multi-chip module 46. The base 48 and cover 50 are joined together by a polymer adhesive 54 which is typically a thermoplastic or thermosetting resin and preferably, an epoxy. The leads 14 of the leadframe are disposed between the base 48 and cover 50 with the inner lead ends 16 within the cavity 52. Bonding of the base to the cover completes assembly of the electronic package 56.

The base 48 and cover 50 may be formed from any suitable material such as a ceramic, polymer, metal, metal alloy or metal compound. A preferred material for the base 48 is an aluminum alloy as disclosed in U.S. Pat. No. 4,939,316. Aluminum alloys are light weight and efficiently conduct heat from the multi-chip module 46. The aluminum alloy is coated with an anodization layer to provide electrical insulation and corrosion resistance. The cover 50 may be any suitable material having a coefficient of thermal expansion close to that of the base 48 to prevent flexing during heating or cooling. Typically, the cover 50 will be formed from the same material as the base.

In the embodiment illustrated in FIG. 7, the electronic package 58 is completed by molding a polymer resin 60 about the multi-chip module 46 and the inner lead ends 16. Any conventional molding resin may be utilized such as an epoxy or polyethersulfone.

While the invention has been described particularly in terms of leaded multi-chip electronic packages, it is equally applicable to single chip leaded packages, as well as other types of packages such as surface mount and pin grid array.

The patents set forth in this application are intended to be incorporated in their entirety by reference herein.

It is apparent that there has been provided in accordance with the present invention, an electrical connector system which fully satisfies the objects, means and advantages set forth hereinabove. While the invention has been described in combination with the embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A module for an electronic package, comprising:
   a support substrate;
   an apertured substrate adjacent said support substrate, said apertured substrate containing at least one aperture;
   a polymer adhesive disposed between and bonded to both said support substrate and to said apertured substrate; and
   at least one semiconductor device disposed within said at least one aperture and bonded to said support substrate by said polymer adhesive.

2. The module of claim 1 wherein said polymer adhesive is a unitary layer extending for substantially the entire surface of the apertured substrate.

3. The module of claim 2 wherein said polymer adhesive is filled with a material selected from the group consisting of silver, aluminum oxide, aluminum nitride, silicon carbide and diamond.

4. The module of claim 3 wherein said polymer adhesive is a thermosetting polymer resin.

5. The module of claim 3 wherein said polymer adhesive is a thermoplastic polymer resin.

6. The module of claim 5 wherein said support substrate is a leadframe die paddle.

7. The module of claim 5 wherein said support substrate is an extension of the base of an electronic package.

8. An electronic package, comprising:
   a base component;
   a cover component;
   a leadframe disposed between said base component and said cover component and bonded to both by a first dielectric sealant, said leadframe containing a plurality of leads approaching a central region and a support substrate disposed within said central region;
   an apertured substrate adjacent said support substrate, said apertured substrate containing at least one aperture;
   a polymer adhesive disposed between and bonded to both said support substrate and to said apertured substrate; and
   at least one semiconductor device disposed within said at least one aperture and bonded to said support substrate by said polymer adhesive.

9. The electronic package of claim 8 wherein said polymer adhesive is a unitary layer extending for substantially the entire surface of the apertured substrate.

10. The electronic package of claim 9 wherein said polymer adhesive is filled with a material selected from the group consisting of silver, aluminum oxide, aluminum nitride, silicon carbide and diamond.

11. The electronic package of claim 10 wherein said polymer adhesive is a thermoplastic polymer resin.

12. The electronic package of claim 11 wherein said base component and said cover component are individually selected from the group consisting of aluminum, aluminum alloys, aluminum composites and aluminum compounds.

13. The electronic package of claim 12 wherein said base component and said cover component are an aluminum alloy coated with an anodization layer.

14. The module of claim 13 wherein said support substrate is a leadframe die paddle.

15. The module of claim 13 wherein said support substrate is an extension of the base of an electronic package.

16. An electronic package, comprising:
   a leadframe containing a plurality of leads approaching a central region and a support substrate disposed within said central region;
   an apertured substrate adjacent said support substrate, said apertured substrate containing at least one aperture;
   a polymer adhesive disposed between and bonded to both said support substrate and to apertured substrate;
   at least one semiconductor device disposed within said at least one aperture and bonded to said support substrate by said polymer adhesive; and
   a molding resin encapsulating a portion of said leads and said central portion.

17. The electronic package of claim 16 wherein said polymer adhesive is a unitary layer extending for substantially the entire surface of the apertured substrate.

18. The electronic package of claim 17 wherein said polymer adhesive is filled with a material selected from the group consisting of silver, aluminum oxide, aluminum nitride, silicon carbide and diamond.

19. The electronic package of claim 18 wherein said polymer adhesive is a thermoplastic polymer resin.

20. The electronic package of claim 19 wherein said molding resin is a thermosetting epoxy.

21. A method for the assembly of an electronic module, comprising the steps of:
   bonding an apertured substrate having at least one aperture to a support substrate with a first polymer adhesive;
   disposing at least one semiconductor device into said at least one aperture; and
   bonding said semiconductor device to said support substrate with said first polymer adhesive.

22. The method of claim 21 wherein both said apertured substrate and said semiconductor device are bonded to said support substrate in the same thermal cycle.

23. The method of claim 21 wherein said apertured substrate and said semiconductor device are bonded to said support substrate in separate thermal cycles.

* * * * *